US005177329A

United States Patent [19]

Klayman

[11] Patent Number: 5,177,329

[45] Date of Patent: Jan. 5, 1993

[54] HIGH EFFICIENCY LOW FREQUENCY SPEAKER SYSTEM

[75] Inventor: Arnold I. Klayman, Huntington Beach, Calif.

[73] Assignee: Hughes Aircraft Company, Los Angeles, Calif.

[21] Appl. No.: 706,908

[22] Filed: May 29, 1991

[51] Int. Cl.[5] .......... H05K 5/00

[52] U.S. Cl. .......... 181/156; 181/199

[58] Field of Search .......... 181/148, 149, 150, 151, 181/152, 153, 154, 155, 156, 199; 381/90, 154, 159

[56] References Cited

U.S. PATENT DOCUMENTS

| | | | |
|---|---|---|---|
| 3,978,961 | 9/1976 | Siebert | 181/156 X |
| 4,064,966 | 12/1977 | Burton | 181/155 |
| 4,628,528 | 12/1986 | Bose et al. | 181/145 X |
| 5,025,885 | 6/1991 | Froeschle | 181/156 |

*Primary Examiner*—Michael L. Gellner
*Assistant Examiner*—Khanh Dang
*Attorney, Agent, or Firm*—Terje Gudmestad; Jeannette M. Walder; Wanda K. Denson-Low

[57] ABSTRACT

A loudspeaker (34,134) excites a quarter wave resonant air column that is folded forward on itself. The column is closed at one end and has an output port located at the other. The output port (20,120) is in line with the speaker so that the one speaker can excite air both at the output port and at the closed end of the resonant column. At resonance, the column loads the speaker, and the speaker regeneratively drives the column output. At other frequencies output from the port is partially from vibration of the air column and partially from the speaker. At resonance the direct speaker output regeneratively reinforces and combines with the output of the resonant column, which has a length of one-quarter of the wavelength of sound propagated in air at the resonant frequency.

5 Claims, 1 Drawing Sheet

HIGH EFFICIENCY LOW FREQUENCY SPEAKER SYSTEM

BACKGROUND OF THE INVENTION

1. Field of the Invention

The present invention relates to sound generation systems and more particularly concerns loudspeaker systems of very low frequency and high efficiency.

2. Description of Related Art

Loudspeaker systems are often provided with speaker components specifically adapted for operating at different frequency ranges, including low range, mid range and high range. Low range components often include special sub woofer speaker systems operable solely in the lowest frequency ranges, in the order of between about 30 and 100 hertz. Generally such very low sub woofer systems require high power driving signals so that an amplifier having a high power output at the low frequencies is needed to efficiently drive the sub woofer. Further, as frequency goes lower, the human ear has less sensitivity and even greater power is required for proper driving of the very low frequency speakers.

Particularly, for very large sound generation systems, such as those used in public address systems or other commercial applications to broadcast sound over very large areas, economic and other constraints will limit available power and may undesirably restrict low frequency output. Accordingly, efficiency of such sound generation systems at very low frequencies is an important consideration.

A common loudspeaker has a vibratory speaker cone, generally driven by a moving voice coil, with the cone having two faces, a forward or front face and a rearward or back face, which are driven as a unit to produce opposite phase sound waves. Particularly at low frequencies, sound waves produced at the rear face of the cone can interfere with the sound waves produced at the front face of the cone so that the net sound produced by the speaker is significantly diminished by destructive interference. At least partly for this reason speakers employed at low frequencies are placed in enclosures or provided with so-called "infinite baffle" arrangements to isolate sound produced from the rear face of the speaker cone from sound produced at the forward face of the speaker cone. This effectively eliminates one half of the sound output of the low frequency speaker, but prevents destructive interference. Effectively then, the output of the low frequency speaker can be reduced by 3 dB when used in most enclosures, thus greatly reducing efficiency. Lack of efficiency of large commercial type sound generation systems has been a widespread problem, requiring larger and more costly amplifying equipment and larger speaker enclosures.

Accordingly, it is an object of the present invention to provide low frequency system that avoids or minimizes above mentioned problems.

SUMMARY OF THE INVENTION

In carrying out principles of the present invention in accordance with a preferred embodiment thereof a low frequency loud speaker system is formed of an enclosure having closed and opened ends and containing an air column. Means are provided to excite the air column at both closed and open ends. As one feature of the invention, a speaker having a vibratory driver with front and back faces is mounted in the enclosure with one of the driver faces positioned to excite air at the closed end, and the other of the driver faces positioned to excite air at the open end. According to another feature of the invention the length of the air column within the enclosure is one-quarter of the wavelength of sound in air at the resonant frequency of the system. In this arrangement the air column is folded and both the speaker cone and the air column provide output from the same port, with the two outputs being in phase at resonance. This provides a regenerative resonant system of high efficiency because the resonating air column is regeneratively driven in phase by the resonant drive imparted to the air column at the output port.

DESCRIPTION OF THE PREFERRED EMBODIMENT

Figure 1:
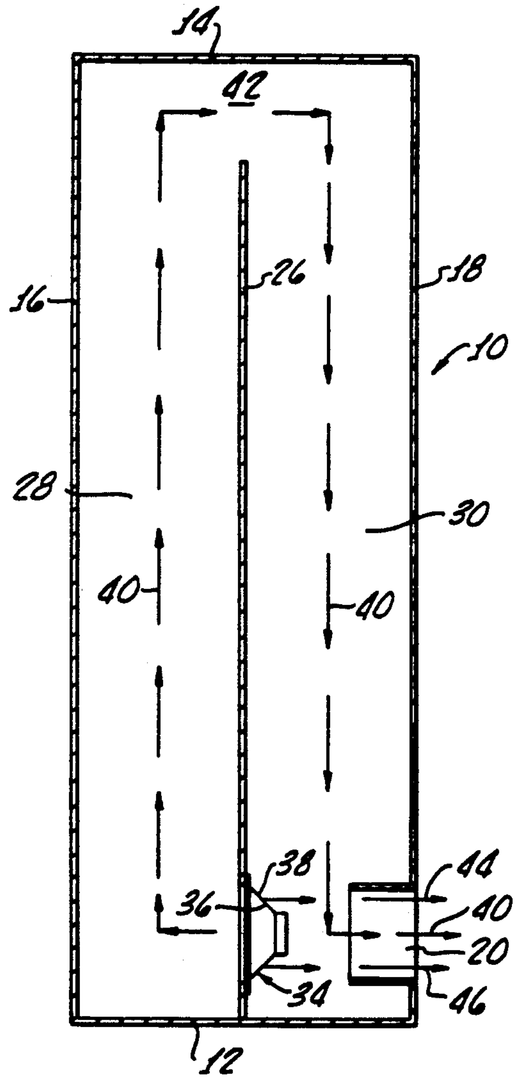
FIG. 1 is a sectional schematic illustration of a low frequency, high efficiency speaker system embodying principles of the present invention.

As illustrated in FIG. 1, a rigid enclosure 10 of conventional speaker enclosure construction is formed with end walls 12,14, a rear wall 16, and a front wall 18. The latter is provided with an opening or enclosure output port 20 closely adjacent to end wall 12. The speaker enclosure may have any suitable cross section and, for example, may be of rectangular cross section, having fixed sides (not shown). A rigid partition or baffle 26 extends completely across the enclosed volume of the speaker, entirely between the enclosure side walls, and from end wall 12 to a point adjacent to but spaced from end wall 14. The partition or baffle 26 thus effectively divides the interior of the enclosure into a folded air column having a first column section 28 extending from end wall 12 to end wall 14 between the partition and rear wall 16. The folded air column includes a second column section 30 extending between end walls 12 and 14 and between the partition 26 and forward wall 18. The two air column sections are interconnected at end wall 14 by a passage 42 between the end wall and the free end of the partition.

Partition 26 is provided with a speaker mounting aperture closely adjacent the end wall 12 and aligned with output port 20. To this aperture is mounted a conventional loud speaker 34. The speaker has a conventional vibratory cone, including a forward face 36 and rear face 38. The speaker axis is aligned with the center of enclosure port 20 and is directed generally perpendicular to the plane of port 20.

The speaker is chosen to have a free air resonance at or below a desired resonant frequency of the system. Such a resonant frequency may be, for example, on the order of about 30 hertz. The length of the folded air column, including passage 42 and column sections 28 and 30, which of course are freely interconnected with one another within the enclosure adjacent end wall 14, is one-quarter of the wavelength of sound propagating in air at the selected system resonant frequency. Thus, for a 30 hertz resonant frequency the total length of the air column, including column section 28 from the speaker to end wall 14 and the length of column 30 from the end wall 30 to the aperture 20, is somewhat greater than nine feet.

The folded air column 28,30 causes the system to act like an organ pipe that is closed at one end and opened at the other, but has the great advantage of providing regenerative vibratory drive of the resonating vibrating air column, which drive is applied at the column output port. When excited at its closed end by face 36 of the speaker 34, the air column resonates at its resonant frequency, which is determined by the length of the column. Accordingly, in operation, the folded column 28,30 is excited by vibration of forward face 36 of speaker 34 at the closed end of the column. The air column vibrates at its resonant frequency to cause resonantly enhanced sound to be projected through port 20, as indicated by arrows 40. The line of arrows 40 emanating from forward face 36 of the cone indicates the propagation of sound excited by this forward face and resonating in the column. Arrows 40 illustrate the sound as traveling from the forward surface 36 through passage 42 adjacent wall 14 that interconnects the two columns, then down through column section 30 and out through the speaker port.

At resonant frequency the time required for a compressional wave to travel from the closed end of the column, that is from a column end at end wall 12, through the length of column 28 to the system port 20 is the same as the time required for the speaker cone, at this frequency, to change its direction of motion from its maximum motion toward the left, as viewed in FIG. 1, to its maximum motion toward the right. Thus, operation of the system may be explained, from one point of view, by considering that motion of the speaker cone toward the left initiates a sound wave at the closed end of the column, with this sound wave traveling the length of the column to the output port 20. By the time that the sound wave (initiated by motion of the cone face 36 toward the left) has reached port 20, the speaker cone is moving to the right. This motion toward the right causes rear face 38 of the cone to produce an additional sound wave component that reinforces the sound wave component produced by the forward side of the speaker, which has propagated the length of the column. The sound directly produced by the back surface 38 of the speaker cone is indicated in the drawing by the arrows 44,46. Thus, at resonant frequency, sound waves produced by both sides of the speaker are used. Sound from the back surface 38 of the speaker, which is in many enclosures effectively discarded, is employed to reinforce and strengthen the vibration of air in the column. The sound from the back surface 38 regeneratively excites the resonating air column which has been primarily excited by the front side 36 of the speaker cone. Thus, not only does the system take advantage of the resonance of the quarter wave air column, but it adds the augmenting synchronous drive of the back surface of the speaker. This synchronous drive of the already resonating air column, by the back face of the speaker, greatly increases amplitude of the resonant vibration. Operation is analogous to imparting a push to a child's swing at the extremes of its motion. Only a small force synchronously applied is needed to achieve very large amplitude of oscillation.

The described system, accordingly, has a very high efficiency, requiring relatively smaller amplifier power to achieve very high amplitude output sound at low frequency. It has been found that the described system has a very low harmonic content and also very low distortion. The closed pipe resonates at its fundamental frequency and at odd harmonics thereof, but, like a conventional closed end organ pipe, produces no even harmonics which would provide a node rather than an anti-node at its open end. At least partly for this reason, harmonics of the system are decreased.

The system works most efficiently at resonance, the frequency at which its length is one-quarter wavelength, where sound from the back side of the speaker regeneratively reinforces vibration of the resonating column. At a frequency twice the resonant frequency the column has a length of one-half wavelength, and thus tends to produce a node, rather than an anti-node, at port 20, thereby providing a sharply decreased output at such double resonant frequency. This significantly decreased output of the system at twice the resonant frequency may aid in design of crossover networks that are commonly used with sub-woofers. A sharp cutoff or rapid drop in amplitude at a low frequency (60 hz for example) is desired for the sub-woofer system. At frequencies above resonant frequency but below double resonant frequency, output of the system is provided partly by the resonating column and partly by direct radiation from the back surface 38 of the speaker.

Figure 2:
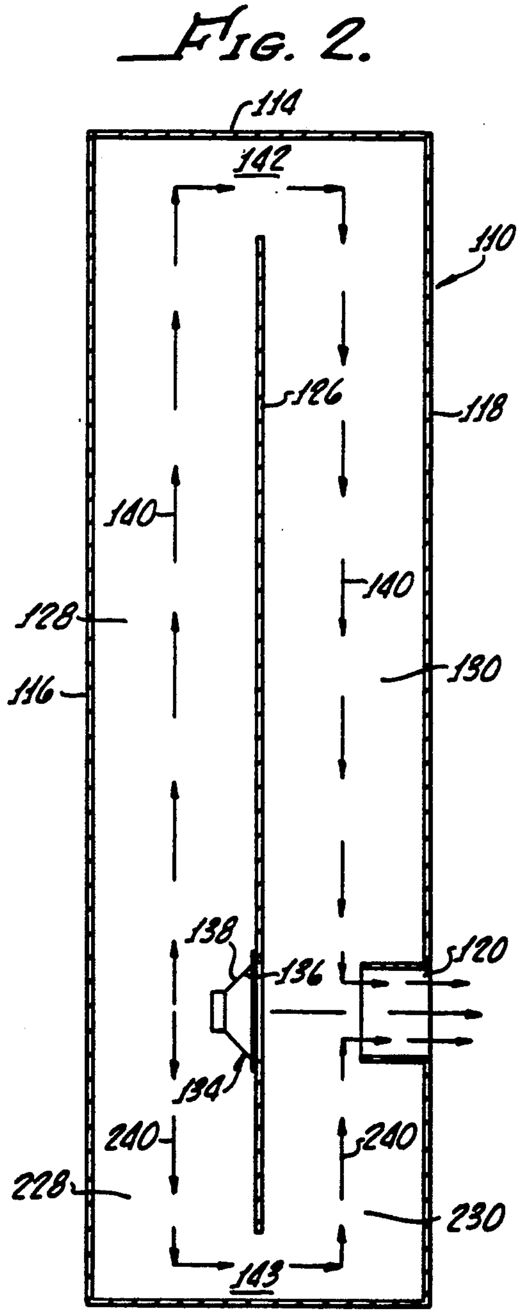
FIG. 2 illustrates a modification of the arrangement of FIG. 1.

The described system is not intended for use above very low frequencies but can be modified for such use. Frequency range of the described system may be extended upwards by a modified configuration, as is illustrated in FIG. 2. In this arrangement a speaker enclosure 110 of conventional rigid construction includes end walls 112 and 114, a rear wall 116 and a forward wall 118, formed with an output port 120 at a distance spaced along the length of the speaker from end wall 112. A rigid partition 126 is fixed along its full length to the speaker enclosure side walls (not shown) and extends between end walls 112,114, but is spaced from each of these end walls to provide passageways 142 at one end and 143 at the other end. Partition 126 is formed with a speaker mounting aperture in which is mounted a conventional loudspeaker 134, having a forward face 136 in this configuration and a rearward face 138. It will be understood that the orientation of the speaker, which in FIG. 2 is opposite the orientation shown in FIG. 1, is purely arbitrary and does not affect operation, since in either embodiment the speaker can be mounted facing the opening or having its rear side facing the opening, as long the axis of the speaker is effectively aligned with the center of the opening.

The arrangement of FIG. 2 effectively provides two simultaneously excited air columns, one of quarter wavelength at the selected resonant frequency, and the other at half wavelength at the selected resonant frequency. Thus a primary or quarter wavelength column is provided by column section 128 between partition 126 and rear wall 116, passageway 142 and column section 130 between partition 126 and front wall 118. This primary column extends from the speaker in the direction of arrows 140, through the enclosure port 120 and has a length of one-quarter of the wavelength of sound in air at the selected primary resonant frequency of the system. As previously mentioned, this resonant frequency may be as low as 30 hertz so that the length of the folded column, including section 128, 130 from the speaker to the aperture, is in the order of a little more than nine feet.

A secondary or half wavelength column is provided by column section 228, passageway 143, and column section 230, between partition 126 and front wall 118. This secondary column extends from the speaker in the direction of arrows 240 through the enclosure port 120 and has a length of one-quarter wavelength at twice the selected resonant frequency of the system. The secondary column is a quarter wavelength column at a secondary resonant frequency which is twice the primary resonant frequency.

In operation of the arrangement of FIG. 2 vibration of the speaker cone excites both primary and secondary columns at the end thereof adjacent the speaker. The folded column 128,130 provides a quarter wavelength column at resonant frequency, and the folded column 228,230, which is excited simultaneously with excitation of column 128,130, provides a quarter wavelength column at twice the resonant frequency. Accordingly, the enclosure illustrated in FIG. 2 provides peak outputs at two selected resonant frequencies. Sound resonating in the quarter wavelength folded column 128,130 is regeneratively combined with the synchronous direct output of the forward face 136 of the speaker. At twice resonant frequency the output of folded column 128,130 drops sharply, but the output of column 228,230 is now at a quarter wavelength resonance, which again is regeneratively reinforced by the in phase sound from the forward face 136 of the speaker at this frequency, which is double the lower resonant frequency. Consequently, significant power and high efficiency is provided at this higher frequency. The system effectively has a dual resonant frequency, being resonant via folded column 128,130 at a lower frequency, such as 30 hertz for example, and also being resonant via folded column 228,230 at a double resonant frequency, which would be 60 cycles. The described arrangements can be implemented in many different sizes and configurations for optimum outputs at selected frequencies. The described systems are of exceedingly high efficiency, with low harmonic content and low distortion. They are structurally simple. Because of their large size and large body of resonating air they provide high mass (mass of the resonating air) and efficient impedance matching with and, therefore, efficient coupling to ambient air.

What is claimed is:

1. A low frequency, high efficiency sound generation system comprising:

an enclosure having a closed end and an open end, said open end having an opening therein, and containing a column of air between said ends, a speaker having a vibratory driver, said speaker driver having front and back faces, and means for mounting said speaker in said enclosure with one of said driver faces positioned to excite air at said closed end and the other of said driver faces positioned to excite air at said open end, wherein said enclosure includes first and second end walls and wherein said mounting means comprises a partition fixed to said first end wall and spaced from said second end wall such that said partition divides the interior of the enclosure into a continuous folded air column extending from the first end wall to the second end wall and between the partition and closed end and from the second end wall to the first end wall and between the partition and the open end, said air column having a substantially uniform cross-section, and wherein said speaker driver face is aligned with the opening in open end of the enclosure.

2. The system of claim 1 wherein said system has a resonant frequency and wherein said folded air column has a length of one-quarter of the wavelength of sound at said resonant frequency.

3. A low frequency, high efficiency speaker system comprising:

an enclosure defining an enclosed air space and having an enclosure opening, a partition fixedly mounted to and within said enclosure, and dividing the interior of said enclosure into a folded air column having first and second adjacent mutually interconnected sections respectively located on opposite sides of said partition, said partition having a speaker mounting aperture aligned with said enclosure opening, and a speaker mounted to said partition at said mounting aperture, wherein said enclosure has first and second end walls, wherein said partition extends between said end walls and is spaced from both said end walls, and wherein said speaker aperture is positioned at a location intermediate the ends of said partition, said partition and enclosure defining a primary folded air column extending along one side of said partition from the speaker around one end of the partition and along the other side of the partition to the speaker and enclosure opening, said partition and enclosure also defining a secondary folded air column extending from said speaker along said one side of said partition in a direction opposite to the direction of extent of said primary folded air column, around the second end of said partition, and along said other side of the partition to said enclosure opening, said primary column having a length greater than the length of said secondary column, wherein said primary and secondary folded air columns have substantially equal cross-sections.

4. The system of claim 3 wherein said primary folded air column has a length equal to one-quarter of the wavelength in sound at a predetermined resonant frequency and wherein the length of said secondary folded air column is equal to one-quarter of the wavelength of sound in air at a frequency twice said resonant frequency.

5. The system of claim 3 wherein said system has a resonant frequency, and wherein said folded air column has a length from the speaker to the enclosure opening that is equal to one-quarter of the wavelength of sound in air at said resonant frequency.

* * * * *